United States Patent [19]

Mehta et al.

[11] Patent Number: 4,727,456

[45] Date of Patent: Feb. 23, 1988

[54] LEADLESS ELECTRONIC COMPONENT CARRIER

[75] Inventors: Mahendra C. Mehta, Palm Beach Gardens; Dirk J. Van Dalen, Royal Palm Beach, both of Fla.

[73] Assignee: Northern Telecom Limited, Montreal, Canada

[21] Appl. No.: 860,246

[22] Filed: May 6, 1986

[51] Int. Cl.$^4$ ............................................. H05K 7/04
[52] U.S. Cl. .................................. 361/417; 206/329; 361/400; 361/420
[58] Field of Search ........................ 174/52 FP; 206/328–329; 339/17 CF; 357/74; 361/400, 404–405, 417–420

[56] References Cited

U.S. PATENT DOCUMENTS

| | | | |
|---|---|---|---|
| 3,346,775 | 10/1967 | Christiansen | 361/393 |
| 3,483,308 | 12/1969 | Wakely | 174/52 FP |
| 3,634,879 | 1/1972 | Longenecker et al. | 339/17 CF |
| 3,653,498 | 4/1972 | Kisor | 206/329 |
| 4,410,231 | 10/1983 | Senor | 339/17 CF |
| 4,417,095 | 11/1983 | Beun | 174/52 FP |

FOREIGN PATENT DOCUMENTS 0070120 1/1983 European Pat. Off. ........ 339/17 CF

OTHER PUBLICATIONS

Deboskey, et al., "All Plastic Plugable Integrated Circuit Module", IBM Technical Disclosure Bulletin, vol. 15, No. 3, 8/72, pp. 813–814.

Primary Examiner—A. D. Pellinen
Assistant Examiner—Gregory D. Thompson
Attorney, Agent, or Firm—Schwartz, Jeffery, Schwaab, Mack, Blumenthal & Evans

[57] ABSTRACT

A carrier for leadless electrical and electronic components has a plurality of recesses, for reception of components. Electrically conductive paths formed on surfaces in the recesses make contact with contacts on the components. The conductive paths extend onto a bottom surface of the carrier and over protrusions or feet on the bottom surface. The protrusions make contact with contact pads on a circuit pattern on a circuit board. The carrier holds components which otherwise could be as readily mounted to the surface of a circuit board as can the carrier. A high number of components per unit surface area of a circuit board can be mounted via the carrier. The carrier can be positioned by an automated apparatus.

9 Claims, 8 Drawing Figures

4,727,456

LEADLESS ELECTRONIC COMPONENT CARRIER

FIELD OF THE INVENTION

This invention relates to a leadless electronic component carrier. Particularly, the invention relates to a component carrier which will hold a plurality of components, the carrier arranged for surface mounting on a circuit board.

RELATED ART

Circuit boards for electronic and electrical apparatus, such as telecommunications systems, have a large number of components mounted on a circuit board. Some components are mounted via leads soldered to circuit patterns on the circuit board. In many cases the leads pass through holes in the circuit board and are soldered to the circuit pattern. Other components are surface mounted directly onto the circuit pattern. There is a maximum limitation of the density of mounting surface mounted components, as space must be left around the component for the gripping head which positions the components on the circuit pattern. In some cases, increased density could be obtained if all the components could be mounted on one surface of the circuit board.

SUMMARY OF THE INVENTION

The invention provides a dielectric carrier having a multiplicity of recesses into each of which a component is positioned. The carrier has conductive paths formed on appropriate surfaces of the recesses, the paths continued to protrusions, or feet, on the base of the carrier. Carriers are surface mounted on a circuit board, the feet acting as contact members which are connected to contact pads on the circuit board by soldering.

In accordance with the invention, there is provided a carrier for leadless electronic components comprising a dielectric member having top and bottom surfaces; a multiplicity of recesses extending down from the top surface; a plurality of protrusions extending from the bottom surface; and conductive paths in the recesses on surfaces of the recesses, the paths extending to and over the protrusions for connecting to contact pads on a circuit board.

BRIEF DESCRIPTION OF THE DRAWINGS

The invention will be readily understood by the following description of certain embodiments, by way of example, in conjunction with the accompanying drawings, in which.

DETAILED DESCRIPTION OF THE PREFERRED EMBODIMENTS

Figure 1:
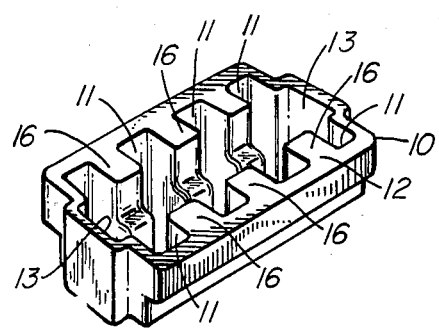
FIG. 1 is a perspective view of one form of carrier.
Figure 2:
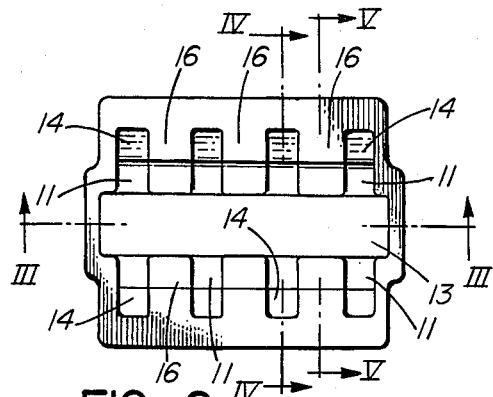
FIG. 2 is a top plan view of a carrier as in FIG. 1.
Figure 3:
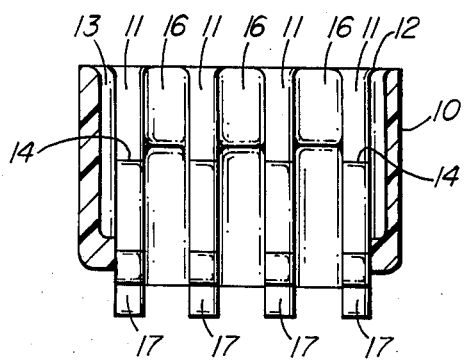
FIG. 3 is a longitudinal cross-section on the line III—III of FIG. 2.
Figure 4:
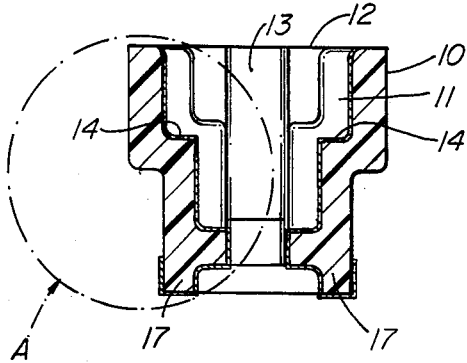
FIGS. 4 and 5 are transverse cross-sections on the lines IV—IV and V—V of FIG. 2, respectively.
Figure 5:
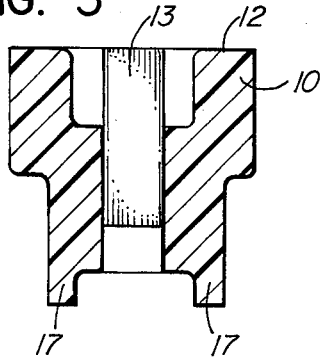

As illustrated in FIGS. 1 to 5, a carrier 10 is of elongate rectangular plan form, and has four elongate rectangular recesses 11 extending transversely across the carrier. The recesses 11 extend down from the top surface 12 of the carrier. The recesses are joined along the centre of the carrier by a longitudinally extending slot 13. The recesses 11 have a particular, predetermined length for the upper part of each recess. The length is then reduced by inwardly extending steps 14. This is seen in FIG. 4. The recesses 11 do not extend completely through the carrier but slot 13 does extend right through. This is particularly seen in FIG. 5.

Thus, the recesses 11 are separated by ribs or lands 16 defined by the recesses 11 and slot 13. Protrusions or feet 17 extend from the bottom surface 18 of the carrier. A protrusion or foot is provided at each end of each recess 11. The protrusions or feet 17 rest on the surface of a circuit board.

Figure 6:
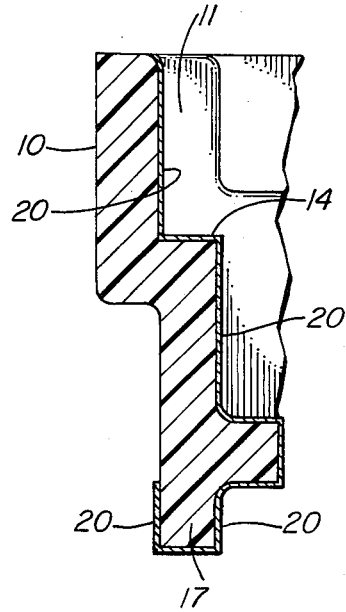
FIG. 6 is an enlarged cross-section of a portion of a carrier to a larger scale, as outlined by the circle A in FIG. 4.

The end surfaces of the recesses have a conducting layer applied thereto. This is seen in FIG. 6, which is an enlarged view of part of a carrier to show a metal layer 20. This layer extends down the end surface of a recess, including over the steps 14. The layer also extends across the bottom of the recess and down through the slot 13, finally covering the protrusion 17. Thus this layer provides for an electrical connection between the end of a component in a recess and the circuit pattern on a circuit board.

The particular form of carrier illustrated in FIGS. 1 to 5, and 6, will accept components of two different lengths. Components having the longer of the two lengths extend between the upper end surfaces of recesses 11, resting on the steps 14. Components having the shorter of the two lengths extend between the lower end surfaces of a recess, below the steps 14. However, if desired, a carrier can be made to hold only one length of component, or more than two lengths. Similarly, the widths of the recesses can vary, and the width of a recess can be narrower at the bottom than at the top by forming a step part way down the recess. The different recesses can also vary in size, one relative to another. The variations and computations of recess size, width, length and depth can be varied, depending upon the components to be carried. The shape of the recesses can vary also, depending upon the components.

Figure 7:
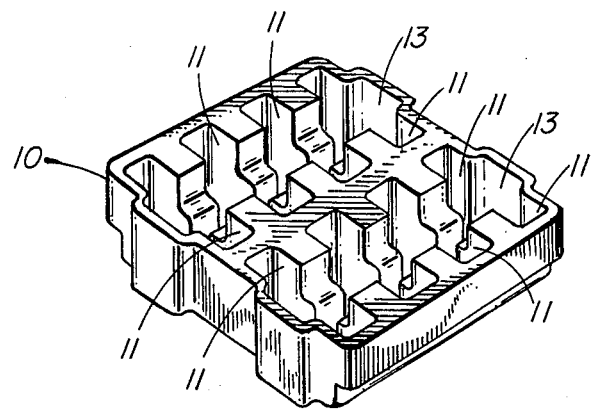
FIG. 7 is a perspective view, similar to that of FIG. 1, of a carrier for two rows of components.
Figure 8:
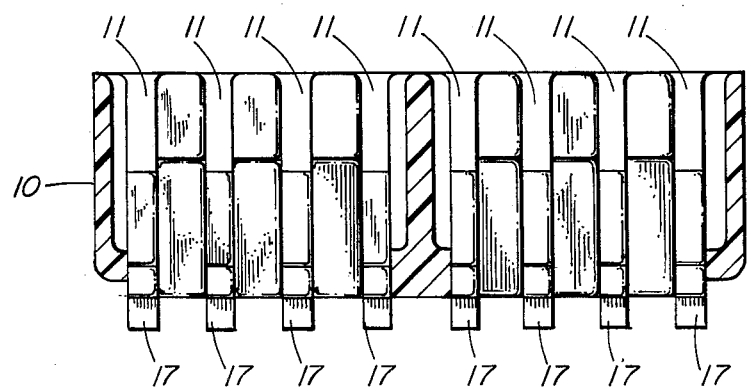
FIG. 8 is a cross-section, similar to that of FIG. 3, through a double row carrier as in FIG. 7.

FIGS. 7 and 8 illustrate a carrier having two rows of recesses 11. The number of rows, and the number of recesses in a row, can vary. As in FIGS. 1 to 5, the carrier has a plurality of recesses 11, with two grooves 13. Protrusions 17 provide for contact with the circuit pattern, the end surfaces of the recesses having a conductive layer extending down to, and over, the protrusions, as in FIG. 6.

The density of packing of components in a carrier is much higher than can be achieved on a circuit board. Further, components which are very difficult to surface mount, because of their shape, can readily be mounted in a carrier which is then mounted on a circuit board. There is a reduction in the number of items to be mounted on a circuit board, and also a reduction in mounting costs. The carriers conveniently are of molded plastic, which can withstand normal soldering temperatures. An example of such a material is PBT (Polyethylene-Butilene-Tetrafilate), referred to as polyester, available under the Trademark Celenex 3211 from Celanese Plastic.

The end surfaces of the recesses can be given a convex arcuate form. This will provide for small variations in component length and for any movement between component and carrier due to temperature coefficient mismatch. Slight deformation of the arcuate shape can readily occur.

What is claimed is:

1. A carrier for leadless electronic components comprising a dielectric member having top and bottom surfaces; a multiplicity of elongated recesses, each extending transversely across a major portion of and down from said top surface, said recesses having a depth and extending in a parallel array, a plurality of protrusions extending from said bottom surface, said protrusions positioned to provide a mounting for said dielectric member; and electrically conductive paths on surfaces of said recesses, said conductive paths extending to and over said protrusions, contacts on the components making contact with said conductive paths on insertion of components into the carrier.

2. A carrier for leadless electronic components, comprising a dielectric member having top and bottom surfaces; a multiplicity of elongated recesses extending down from said top surface, said recesses extending in a parallel array in a single row, a plurality of protrusions extending from said bottom surface, said protrusions positioned to provide a mounting for said dielectric member; and electrically conductive paths on surfaces of said recesses, said conductive paths extending to and over said protrusions, contacts on the components making contact with said conductive paths on insertion of components into the carrier.

3. A carrier for leadless electronic components comprising a dielectric member having top and bottom surfaces; a multiplicity of elongated recesses extending down from said top surface, said recesses extending in a parallel array in a plurality of rows, a plurality of protrusions extending from sid bottom surface, said protrusions positioned to provide a mounting for said dielectric member; and electrically conductive paths on surfaces of said recesses, said conductive paths extending to and over said protrusions, contacts on the components making contact with said conductive paths on insertion of components into the carrier.

4. A carrier for leadless electronic components comprising a dielectric member having top and bottom surfaces; a multiplicity of elongated recesses extending down from said top surface, said recesses extending in a parallel array, a plurality of protrusions extending from said bottom surface, each of said protrusions being aligned with a recess, said protrusions positioned to provide a mounting for said dielectric member; and electrically conductive paths on surfaces of said recesses, said conductive paths extending to and over said protrusions, contacts on the components making contact with said conductive paths on insertion of components into the carrier.

5. A carrier for leadless electronic components comprising a dielectric member having top and bottom surfaces; a multiplicity of elongated recesses extending down from said top surface, said recesses extending in a parallel array and a further recess extending normal to and intermediate of the ends of said recesses, a plurality of protrusions extending from said bottom surface, said protrusions positioned to provide a mounting for said dielectric member; and electrically conductive paths on surfaces of said recesses, said conductive paths extending to and over said protrusions, contacts on the components making contact with said conductive paths on insertion of components into the carrier.

6. A carrier as claimed in claim 5, said further recess extending through to said bottom surface, said recesses extending to a predetermined distance from said bottom surface.

7. A carrier as claimed in claim 5, said electrical conductive paths each comprising a metal strip extending down a surface of each said recesses, said strip continuing to said further recess, through said further recess and over said protrusions.

8. A carrier for leadless electronic components comprising a dielectric member having top and bottom surfaces; a multiplicity of elongated recesses extending down from said top surface, said recesses extending in a parallel array in a stepped configuration, a plurality of protrusions extending from said bottom surface, said protrusions positioned to provide a mounting for said dielectric member; and electrically conductive paths on surfaces of said recesses, said conductive paths extending to and over said protrusions, contacts on the components making contact with said conductive paths on insertion of components into the carrier.

9. A carrier as claimed in claim 8, each of said recesses extending a predetermined distance at an upper part and extending a reduced distance at a lower part, to form a step intermediate the top and bottom surfaces.

* * * * *